United States Patent
Spahn

(10) Patent No.: US 6,237,529 B1
(45) Date of Patent: May 29, 2001

(54) SOURCE FOR THERMAL PHYSICAL VAPOR DEPOSITION OF ORGANIC ELECTROLUMINESCENT LAYERS

(75) Inventor: Robert G. Spahn, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/518,600

(22) Filed: Mar. 3, 2000

(51) Int. Cl.⁷ .................................................. C23C 14/00

(52) U.S. Cl. ...................... 118/726; 219/121.5; 392/452; 118/723 VE

(58) Field of Search .................. 204/298.02, 298.09; 118/726, 723 VE; 219/121.15, 394; 392/303, 386, 452, 388, 389, 390

(56) References Cited

U.S. PATENT DOCUMENTS

| | | |
|---|---|---|
| 2,447,789 | 8/1948 | Barr . |
| 3,271,562 | 9/1966 | Roberts, Jr. et al. . |
| 3,466,424 | 9/1969 | Adams . |
| 4,401,052 | 8/1983 | Baron et al. . |
| 4,842,893 | * 6/1989 | Yializis et al. .................... 427/497 |
| 4,849,606 | * 7/1989 | Martens, III et al. ............ 392/390 |
| 5,377,429 | * 1/1995 | Sandhu et al. .................... 118/715 |
| 5,596,673 | * 1/1997 | Ward et al. ....................... 392/389 |
| 5,803,976 | * 9/1998 | Baxter et al. ..................... 118/726 |

OTHER PUBLICATIONS

Vacuum Technology and Space Simulation, by Donald J. Santeler, et al., Chapter 5 "Gas Flow in Components and Systems," (NASA SP–105: Washington 1966), pp. 83–121.

* cited by examiner

Primary Examiner—Jeffrie R. Lund
Assistant Examiner—Sylvia R. MacArthur
(74) Attorney, Agent, or Firm—Raymond L. Owens

(57) ABSTRACT

A thermal physical vapor deposition electroluminescent source includes a housing defining an enclosure having side walls and a bottom wall, the enclosure receiving solid organic electroluminescent material which can be vaporized, and the width of the housing having a dimension $w_h$; and the housing has a conductive portion defining a vapor efflux aperture slit having a width $w_s$ for permitting vaporized electroluminescent materials to pass through the slit onto a surface of a substrate. A conductive baffle member has width b, the baffle member being centered on the slit and spaced from the side walls and spaced from the top plate by a distance m, the baffle member substantially providing a line-of-sight covering of the slit preventing direct access of vaporized electroluminescent materials to the slit, and preventing particulate electroluminescent materials from passing through the slit; and a straight-line projection from an edge of the slit to an edge of the baffle member onto a side wall defining a position on the side wall such that such position is spaced from the top plate by a dimension L. The ratio of the dimensions $w_h$ to $w_s$ is in a range of from 1.5 to 6.0; the ratio of L to $w_s$ is in a range of from 2 to 6; and the ratio of m to L is in a range of from 0.15 to 0.40. Heat is applied to different parts of the housing to cause vapor deposition.

17 Claims, 5 Drawing Sheets

SOURCE FOR THERMAL PHYSICAL VAPOR DEPOSITION OF ORGANIC ELECTROLUMINESCENT LAYERS

FIELD OF THE INVENTION

The present invention relates to the thermal, physical vapor deposition of organic electroluminescent layers.

BACKGROUND OF THE INVENTION

Thermal, physical vapor deposition is a well known technique for the coating of a substrate with a material which is held in a container or in a housing, the deposition source, and heated to the point of vaporization, the vapor moving out of the deposition source and condensing on a substrate to be coated. Most often this process is carried out with both the deposition source holding the material to be vaporized and the substrate to be coated contained in a vessel which is evacuated to a level of pressure in a range of from $10^{-7}$ to $10^{-2}$ Torr. Such reduced pressure is useful in avoiding unwanted reactions between either the materials of which the source is constructed or the deposition materials contained in the deposition source with the atmosphere in the vessel as the temperature of the deposition source is increased to the point where the deposition materials vaporize.

Typically, the deposition source is made from an electrically resistive material whose temperature will increase when an electrical current is passed through the container walls. The deposition material inside is then heated by radiation from the walls and by conduction from contact with the walls. Typically, the container is shaped like a box, with an aperture to allow escape (efflux) of the vapor in the direction of the substrate. However, other methods of heating the walls have been used, including radiation from coils surrounding the container, induction heating of the container with suitable coils, electron impact, and irradiation from an optical source.

If the container or housing is fabricated from a material in such a way as to be liquid-tight, then there is no concern whether vaporization is by sublimation from the solid or evaporation from a liquid formed as the solid first melts. In any case, it is well known that the container can be lined with a high-temperature-compatible, liquid-tight material, such as quartz, a ceramic, a shaped carbon material, or the like and that such liner be heated by a surrounding resistive heater.

Thermal, physical vapor deposition sources have been used to vaporize and deposit onto a substrate layers comprised of a wide range of materials, for example low temperature organics, metals, or fairly high temperature inorganic compounds. In the case of organic layer deposition, the starting material is typically a powder. It has been recognized that such organic powders present a number of challenges to this type of thermal vaporization coating. First, many of the organics are relatively complex compounds (high molecular weight), with relatively weak bonding, so that care must be taken to avoid decomposition during the vaporization process. Next, the powder form can give rise to particles of unvaporized electroluminescent material leaving the deposition source with the vapor and being deposited as undesirable lumps on the substrate. Such lumps are also commonly referred to as particulates or particulate inclusions in a layer formed on a substrate. This is additionally exacerbated in that the powder form also has a very large surface area which may hold absorbed or adsorbed water or volatile organics which can be released during heating and can cause eruptions of gas and particulates to be thrown outward from the deposition source toward the substrate. Similar considerations pertain to materials which melt before vaporization (evaporation) and can result in droplets being ejected to the substrate surface.

There are many applications where these unwanted particulates or droplets will result in unacceptable defects in a product, particularly in electronic or optical applications where dark spots may result in images or shorts or opens may result in electronic device failures.

There has been much effort spent in devising organic deposition sources designed to more uniformly heat such an organic powder charge and to also prevent the bursts of particulates or droplets from reaching the substrate. Numerous designs of complicated baffling structures between the source material and the exit opening have been suggested to try to assure only vapor exits. See for examples U.S. Pat. Nos. 3,466,424 and 4,401,052. There are also various elaborate container features added interior to the source material container seeking to achieve maximum contact area between the organic vapor deposition material and hot members of the container. See for examples U.S. Pat. Nos. 2,447,789 and 3,271,562.

SUMMARY OF THE INVENTION

It is an object of the present invention to provide a thermal, physical vapor deposition source for organic electroluminescent material which eliminates the problems of the prior art deposition sources discussed above.

It is another object of the present invention to provide a thermal physical vapor deposition source having a simplified baffle structure which allows maximum passage of vapor while eliminating the direct exit of particulate electroluminescent materials.

It is yet another object of the present invention to provide a thermal physical vapor deposition source with lower thermal inertia or more rapid temperature response to changes in power input to the source.

These and other objects are achieved by a thermal physical vapor deposition source for vaporizing solid organic electroluminescent materials and applying a vaporized electroluminescent material as a layer onto a surface of a substrate in forming a display device, comprising:

a) a housing defining an enclosure having side walls and a bottom wall, the enclosure receiving solid organic electroluminescent material which can be vaporized, and the width of the housing having a dimension $w_h$;

b) the housing is further defined by a top plate having a conductive portion and defining a vapor efflux aperture slit having a width $w_s$ for permitting vaporized electroluminescent materials to pass through the slit onto a surface of a substrate;

c) a conductive baffle member having a width b, the baffle member being centered on the slit and spaced from the side walls and spaced from the top plate by a distance m, the baffle member substantially providing a line-of-sight covering of the slit preventing direct access of vaporized electroluminescent materials to the slit, and preventing particulate electroluminescent materials from passing through the slit;

d) a straight-line projection from an edge of the slit to an edge of the baffle member onto a side wall defining a position on the side wall such that such position is spaced from the top plate by a dimension L;

e) the ratios of the dimensions: $w_h$ to $w_s$ being in a range of from 1.5 to 6.0; L to $w_s$ being in a range of from 2 to 6; and m to L being in a range of from 0.15 to 0.40; and f) means for applying an electrical potential to different parts of the housing to cause heat to be applied to the solid organic electroluminescent material in the enclosure causing the solid organic electroluminescent material to vaporize so that vaporized electroluminescent material is projected off of the side walls and the top plate of the housing and the top surface of the baffle member through the slit onto the substrate while particulate electroluminescent materials are prevented from passing through the slit by the baffle member.

Advantages

A feature of the present invention is that lower heating levels can be applied to solid organic electroluminescent materials to achieve a desired rate of vapor exit from the source through the efflux aperture, providing an effective way of applying vaporized electroluminescent material as a layer to a substrate at the highest rate with the least chance of decomposition.

Another feature of the present invention is that the placement of the baffle member with respect to the slit substantially prevents particulate electroluminescent material from passing through the slit.

Another feature of the present invention is that in the cases where rapid thermal response is desired, this can be achieved by using the implementation where current is passed only through the top plate of the housing and the baffle member and vaporization is virtually entirely by radiation from above.

DETAILED DESCRIPTION OF THE INVENTION

Figure 1:
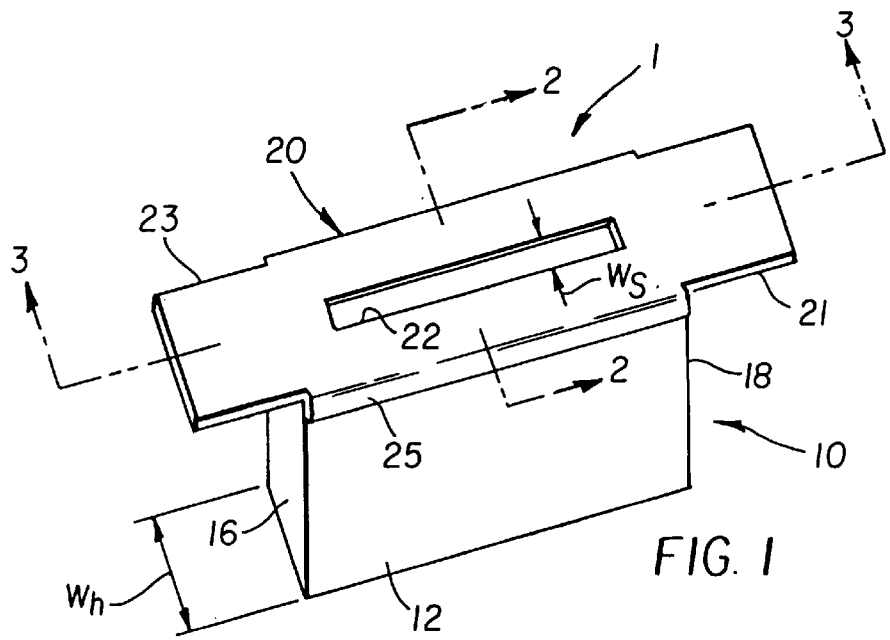
FIG. 1 is a schematic perspective view of a thermal physical vapor deposition source illustrating a housing for the deposition material and having a slit-shaped efflux aperture in accordance with one aspect of the present invention. (In this case it would be called a linear source due to the extended length in one dimension.)
Figure 2:
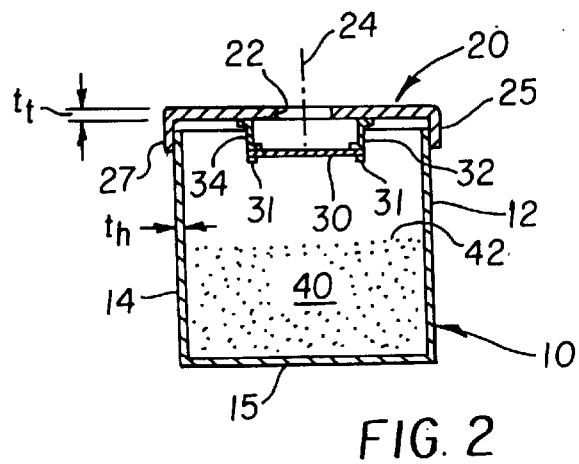
FIG. 2 is a cross section of the source taken along the section line 2—2 in FIG. 1.
Figure 3:
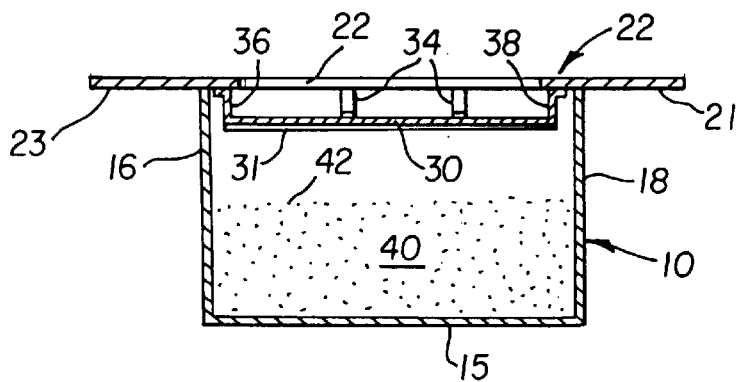
FIG. 3 is a cross section of the source taken along the section line 3—3 in FIG. 1.

Turning to FIGS. 1, 2, and 3, there are shown a perspective view and sectional views, respectively, of a rectangular thermal physical vapor deposition source 1. The rectangular thermal physical vapor deposition source 1 consists of a rectangular housing 10 defined by side walls 12 and 14, end walls 16 and 18, and bottom wall 15. The housing 10 contains solid organic electroluminescent vapor deposition material 40 to an initial level 42. The housing can be constructed of any material capable of shaping and of withstanding the elevated temperatures required for vaporizing the solid organic electroluminescent deposition material of interest. The walls may be made of made refractory metals with relatively high electrical resistivity so that when a current is passed through them they are resistively heated to a temperature sufficient to in turn heat the organic electroluminescent vapor deposition material 40 contained in the housing 10 by radiation and conduction. Such housing materials are well known to those skilled in the art, but in many cases tantalum is particularly attractive for ease in mechanical shaping and welding, for having an electrical resistivity in a useful range at a thickness th which yields a mechanically robust container, and for limited chemical reactivity with most of the organic electroluminescent materials of interest at the temperatures required for vaporization. These walls may also be made of a high temperature dielectric material such as quartz, pyrex, alumina, or one of the numerous other ceramic materials known to those skilled in the art. Particularly in cases where the solid organic electroluminescent vapor deposition material melts before vaporizing, such dielectric materials can be useful for containing the molten material better than a welded metal housing.

The final, sixth wall of the rectangular thermal physical vapor deposition source 1 is a rectangular top plate 20 having a vapor efflux aperture 22. The vapor efflux aperture 22 is typically centered in the plane of the rectangular top plate 20 with respect to the housing 10. The function of the vapor efflux aperture is to allow escape of vaporized organic electroluminescent vapor deposition material from the housing 10 in the direction of a substrate, for example the substrate 102 in FIG. 4.

Figure 5:
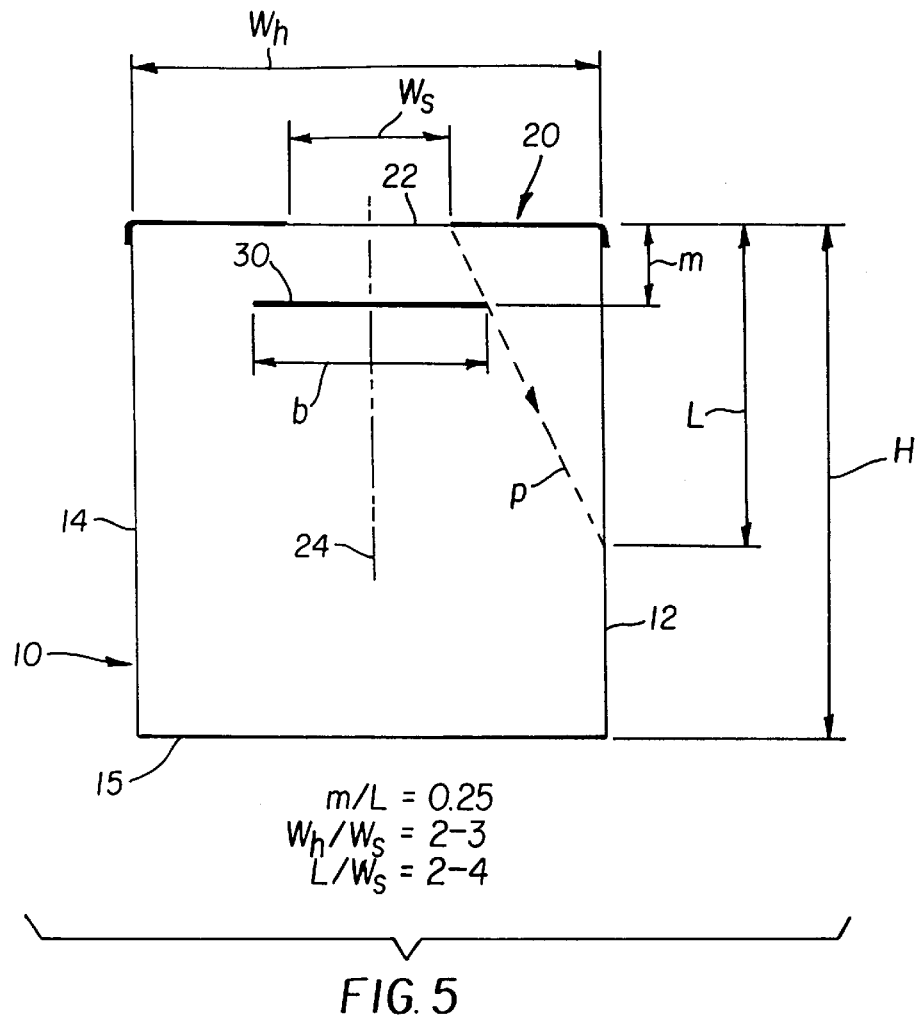
FIG. 5 is a schematic sectioned view of a rectangular source illustrating various dimensions to be used in an optimal source design, in accordance with this invention.

A rectangular baffle member 30 is centered below the rectangular efflux aperture 22 so as to block direct exit of particulates or droplets of the vapor deposition material 40 through the efflux aperture in the direction of the substrate. A feature of the invention is the selection of the proper set of dimensions for to optimal sizing of the relative dimensions of the of the rectangular thermal physical vapor deposition source 1, the rectangular housing 10, the rectangular top plate 20, the rectangular efflux aperture 22, the rectangular baffle member 30, and the spacing of the baffle member below the rectangular top plate 20 so as to allow maximum probability of the exit of vapor while minimizing the chance of exit of particulates or droplets. The dimensions of interest are illustrated in FIG. 5.

Figure 4:
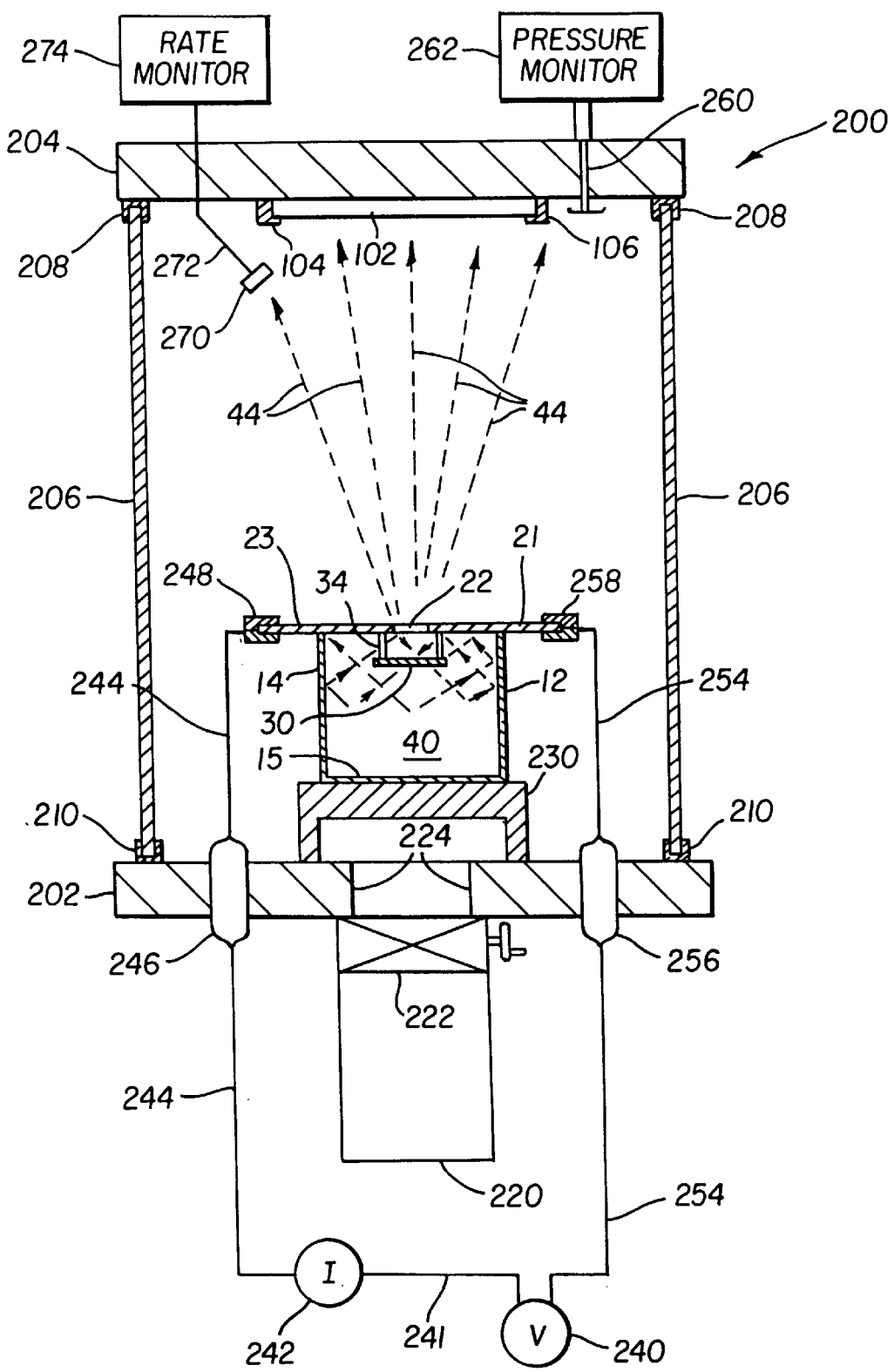
FIG. 4 is a representative schematic view of a source such as illustrated in FIG. 1 installed in a vacuum vessel containing a substrate to be coated.

The top plate 20 has electrical connecting flanges 21 and 23 which can be connected to an electrical power source by connecting clamps (see FIG. 4). As indicated schematically in FIGS. 1 and 2, the top plate 20 has sealing lips 25, 27 extending at least along the longer side walls 12, 14 of the housing 10. It will be appreciated that other sealing means can be constructed; for example, a preformed ceramic seal (not shown) can be positioned over each of the side walls 12, 14, and end walls 16, and 18 of the housing 10, and such seal can sealingly engage the top plate 20.

The housing 10 has a width dimension $w_h$, and the vapor efflux aperture 22 of the top plate 20 has a width dimension $w_s$. The slit-shaped vapor efflux aperture 22 is centered with respect to housing 10, as schematically indicated by a vertical centerline 24 in FIG. 2.

A rectangular baffle member 30 is spaced from the top plate 20 by baffle supports 32 and 34 which may be affixed to the baffle member and to the top plate by spot welding, riveting, or by other fastening means. The baffle member 30 has baffle terminations 36 and 38 (see FIG. 3) and may have features which ensure structural stability of the baffle member 30, for example baffle stabilizers 31 constructed in a form of ribs or other structural design.

The baffle member 30 is positioned with respect to the vapor efflux aperture 22 such that the baffle member 30 prevents particulates or droplets of the organic electroluminescent vapor deposition material 40 from being ejected through the aperture while permitting molecules of vaporizing organic electroluminescent material 40 to follow pathways within the housing 10 and around the baffle member 30 for final exit through the vapor efflux aperture 22 in a direction toward the substrate (see FIG. 4).

Both the top plate 20 and the baffle member 30 are heated resistively by passing a current therethrough via electrical connections to a power source at the electrical connecting flanges 21, 23 of the top plate. If it is desired to heat at least some portion of the housing 10, a wall thickness, th, of the housing is selected to provide a resistively heated path for electrical current flow heat from the side walls, end walls, and bottom walls of the housing 10 can be added to the solid organic electroluminescent vaporization deposition material 40 in addition to the radiant heat from the top plate 20.

Due to the rectangular design of the thermal physical vapor deposition source 1, this source is also referred to as a linear vapor deposition source.

An important aspect of the thermal physical vapor deposition source of the present invention, for use with organic electroluminescent vapor deposition materials 40, is that radiant heat from the rectangular top plate 20 and from the rectangular baffle member 30 heats the uppermost layer, for example the uppermost initial layer 42 of the solid organic electroluminescent material 40, by radiation only, thus providing a maximum chance for the uppermost layer going from the solid phase to the vapor phase and a minimum chance of heating solid organic electroluminescent material 40 below the uppermost level to a temperature at which adsorbed or absorbed gases evolving from the solid organic electroluminescent (usually powdery) material would cause the ejection of particulates or droplets upwards toward the vapor efflux aperture 22.

Turning to FIG. 4, a physical vapor deposition system 200 is shown schematically and includes the thermal physical vapor deposition source operative to form an organic electroluminescent coating over a substrate 102 within a vacuum vessel or a vacuum chamber. The vessel or chamber is formed conventionally of a base plate 202, upper plate 204, chamber walls 206 which are sealingly engaged with the base plate 202 by a vacuum seal 210 and with the upper plate 204 by a vacuum seal 208. A vacuum pump 220 evacuates the chamber via a vacuum valve 222 and a pumping port 224 in the base plate 202 to a pressure in a range of from $10^{-2}$ to $10^{-7}$ Torr, as indicated by a pressure monitor 262 having a pressure monitor port 260 extending into the chamber through the upper plate 204.

The electrical connecting flanges 21 and 23 of the thermal physical vapor deposition source 1 are connected via connecting clamps 248 and 258, respectively, to electrical leads 244 and 254 and via electrical power feedthroughs 246 and 256, respectively, and electrical leads 244 and 254, respectively to power source 240. A current meter 242 is inserted in electrical lead 241 to indicate a current flow through the thermal physical vapor deposition source 1 as a function of an adjustable voltage provided by the power source 240.

The thermal physical vapor deposition source 1 is supported by a thermally insulating structure 230 against the generally metallic base plate 202, the construction of the thermally insulating structure 230 such as to permit efficient evacuation of the vacuum vessel or chamber.

When the top plate 20 and baffle member 30 of the thermal physical vapor deposition source 1 (see the description of FIGS. 1–3) are heated sufficiently by current I passing therethrough, vapor 44 of organic electroluminescent material exits through the vapor efflux aperture 22 following the deflections off the side walls 12 and 14 of the housing 10, the underside of the top plate 20, and the baffle member 30. Vapor 44 of organic electroluminescent material, shown in dotted outline, is directed generally upwardly toward the upper plate 204 and thus toward the substrate 102 which is shown held against the upper plate 204 by substrate mounting brackets 104 and 106. It will be appreciated that substrate 102 can be mounted on a temperature-controlling surface instead of mounting against the upper plate 204 in order to achieve particular properties of an organic electroluminescent layer to be formed, for example, adhesive properties and crystallographic properties.

The vapor 44 of organic electroluminescent material is also incident on a vapor deposition rate monitor element 270 which is connected to a rate monitor 274 by an electrical lead 272. As commonly practiced, a shutter (not shown) can be used to cover the substrate 102 until such time as a constant vapor deposition rate is indicated by the rate monitor 274. Such shutter is opened to provide vapor deposition of an organic electroluminescent layer over the substrate 102.

The thermal physical vapor deposition system 200 has been found to be particularly effective in forming organic electroluminescent layers over a substrate which, together, provide an organic electroluminescent device, as will be described in detail hereinafter with reference to FIG. 10.

Referring now to FIG. 5, a schematic sectional view of a rectangular vapor deposition source illustrates various dimensions which are important in achieving an optimal source design in accordance with the invention. To a first approximation, an optimal design of the thermal physical vapor deposition source is provided by using aspects of a theory of fluid flow through blocked "pipes," as described by Donald J. Santeler, Donald W. Jones, David H. Holkeboer, and Frank Ragano, *Vacuum Technology and Space Simulation*, Chapter 5 "Gas Flow in Components and Systems," (NASA SP-105: Washington, 1966), pp. 83–121, to design the rectangular top plate 20, the rectangular efflux aperture 22, the rectangular baffle member 30, and the placement of the baffle member below the rectangular top plate 20 for maximum probability of the exit of vapor. To a first approximation, one can work with FIG. 5, page 102 of this publication to improve a source design. Table 1 shows the impact of changes relative to the thermal physical vapor deposition of a sensitive organic material in a web coating process from several thermal physical vapor deposition sources with different design parameters, where the quantity "α" is the probability of exit of material from the source and greater probability produces higher coating rates at a given temperature or lower source temperatures to produce a given rate, thus less chance of thermal decomposition of the organic material in the source.

TABLE 1

Source Behavior

| Source<br>Parameter | A | B | C |
|---|---|---|---|
| $w_h$(in) | 20 | 2.5 | 4.0 |
| $w_s$(in) | 5/16 | 5/16 | 5/16 |
| b(in) | 3/4 | 3/4 | 3/4 |
| m(in) | 3/16 | 3/16 | 3/16 |
| L(in) | 0.72 | 0.94 | 1.58 |
| L/($w_s$) | 2.3 | 3.0 | 5.1 |
| m/L | 0.26 | 0.2 | 0.12 |
| $w_h/w_s$ | 6.4 | 8.0 | 12.8 |
| α | 0.066 | 0.054 | 0.003 |
| Coating (feet to degraded) | >8000 | >1500 | <200 |

The result was to go from coatings on a substrate wherein the coatings very rapidly degraded with depletion of the solid organic electroluminescent material in the source, even when coating at low deposition rates, to no degradation of the coatings even after nearly total depletion of the solid organic electroluminescent material while coating at high deposition rates. Having observed the usefulness of this theory when approximately extrapolated from a circular pipe geometry to a rectangular source geometry, one can then go back to the original references from which the above publication was prepared and run Monte Carlo calculations over changes in all of the parameters to define optimum design points for geometries of interest. There is little change from the rectangular geometry illustrated in FIG. 5 to circular geometry designs illustrated in FIGS. 7 and 8.

An optimal rectangular source design is provided for a source having height dimensions H of the housing 10, a width dimension $w_h$ between the side walls 12 and 14 of that housing, a width dimension $w_s$ of the vapor efflux slit aperture 22 of the top plate 20, a width dimension b of the rectangular baffle member 30, and a spacing m between the baffle member 30 and the top plate 20, if a straight-line projection p (shown in dashed outline) from one edge of the aperture 22 to an edge of the baffle member 30 on the same side of a vertical centerline 24 provides a projection distance L from the top plate 20 along the side wall 12. In accordance with the present invention, it has been determined that the ratios of the dimensions: $w_h$ to $w_s$ should be in a range of from 1.5 to 6.0; L to $w_s$ should be in a range of from 2 to 6; and m to L should be in a range of from 0.15 to 0.40. More effective ranges are when the ratio of the dimensions $w_h$ to $w_s$ is in a range 2.0 to 3.0, L to $w_s$ is in a range 3.5 to 5, and m to L is in a range 0.25 to 0.30. Under these definitions, it has been determined that the preferable dimensions for the rectangular source design are m/L=0.25; $w_h/w_s$=2.4; and L/$w_s$=4.

Figure 6:
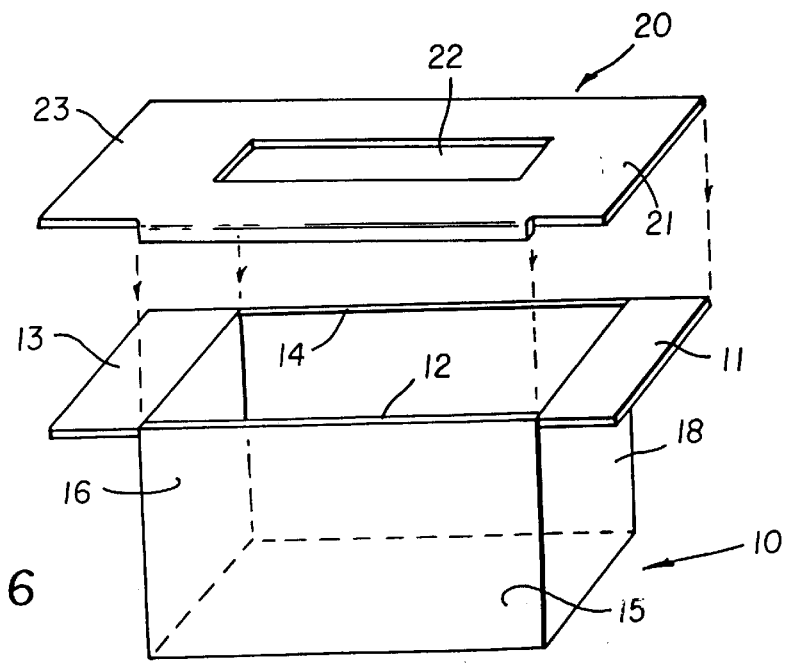
FIG. 6 is a perspective view of an alternative configuration of the source of FIG. 1 with electrically conducting flanges for the resistive heating of all walls of the source.

Turning to FIG. 6, a schematic perspective view is shown of a rectangular thermal physical deposition source which differs from the source of FIG. 1 in that the housing 10 has electrical connecting flanges 11 and 13 which mate with the corresponding electrical connecting flanges 21 and 23 of the top plate 20 when the top plate is positioned in contact with the housing, as schematically indicated by the dashed lines and arrows. By appropriate selection of a thickness dimension $t_t$ of the resistively heatable top plate 20 and of a different thickness dimension $t_h$ of the housing side walls 12, 14, and end walls 16, and 18 and of the housing bottom wall 15 (see FIGS. 2 and 3), the top plate 20 and the baffle member 30 can still provide the heating of the solid organic electroluminescent material 40 to control its vaporization, while a reduced degree of heating of the housing 10 can provide a bias-level heating to enhance slow outgassing of gases entrapped in the solid organic electroluminescent material 40.

Figure 7:
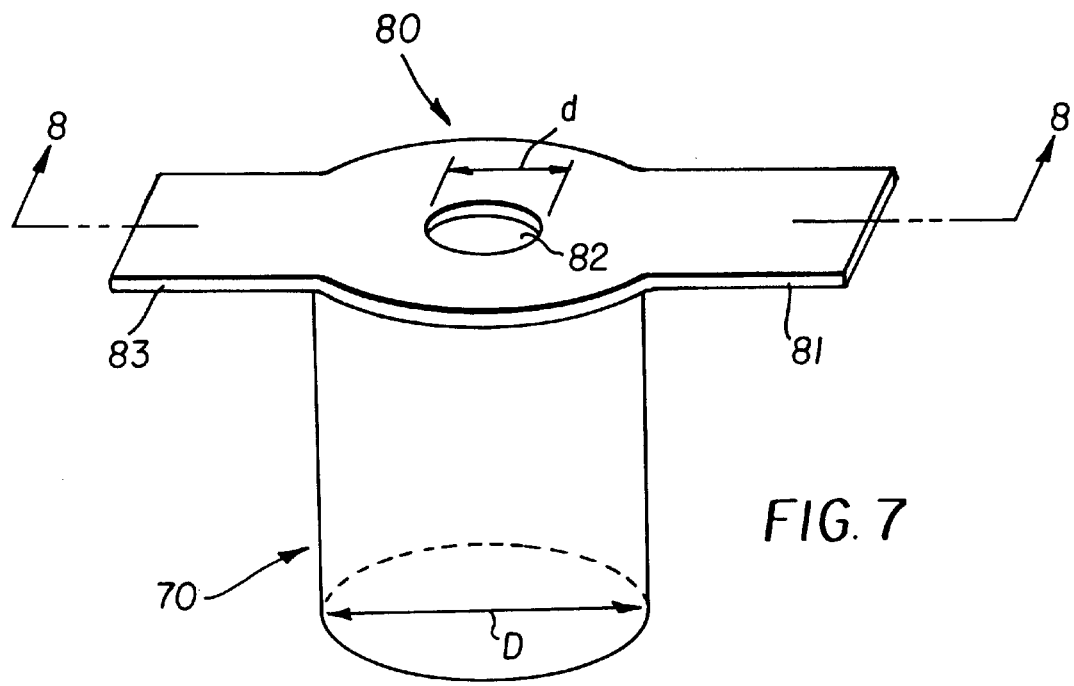
FIG. 7 is a schematic perspective view of a thermal physical vapor deposition source having a cylindrical geometry, in accordance with another aspect of the present invention.
Figure 8:
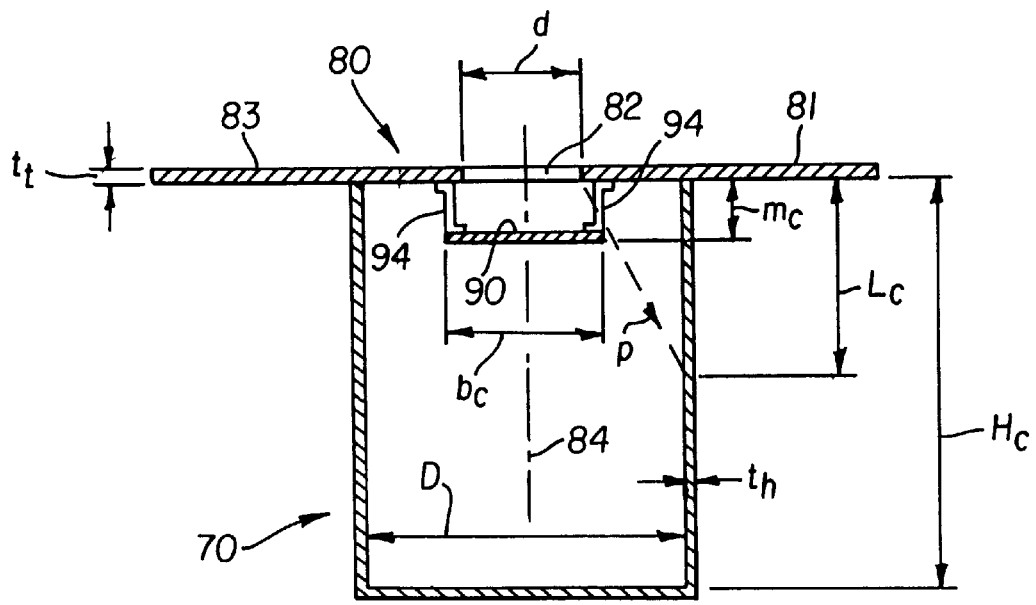
FIG. 8 is a schematic sectional view of a cylindrical source taken along the section line 8—8 in FIG. 7 and illustrating various dimensions to be used in an optimal source design, in accordance with this invention.

Referring to FIGS. 7 and 8, there are shown schematically a perspective and a sectional view, respectively, of a cylindrical embodiment of a thermal physical vapor deposition source. A cylindrical housing 70 has a diameter D, a height dimension $H_c$, and a thickness dimension $t_h$ of housing side wall and bottom wall. Centered on a vertical centerline 84 with respect to the housing 70 is a circular baffle member 90 having a dimension $b_c$ and a spacing $m_c$ to a circular top plate 80. The circular top plate 80 has a circular vapor efflux aperture 82 having a diameter d, a thickness dimension $t_t$, and electrical connecting flanges 81 and 83. The baffle member 90 is attached to the top plate 80 by baffle supports 94.

In analogy to the optimal source design described with reference to FIG. 5, an optimal cylindrical source can be configured by a straightline projection p onto a side wall of the cylindrical housing 70 between an edge of the circular vapor efflux aperture 82 and an edge of the circular baffle member 90, all projections on the same side of the vertical centerline 84, so that the projection onto the side wall occurs at a distance $L_c$ from the top plate 80. For the cylindrical source, the operative ranges of the ratios of the dimensions are D to d in a range of from 1.5 to 6.0; L, to d in a range of from 2 to 6; and m to $L_c$ in a range of from 0.15 to 0.40. The preferred ranges of the ratios of the dimensions are D to d in a range 2.0 to 3.0, L to d in a range 3.5 to 5, and $m_c$ to $L_c$ in a range 0.25 to 0.30. The preferable dimensions for the cylindrical source are as follows:

$$m_c/L_c = 0.25;$$

$$D/d = 2.4; \text{ and}$$

$$L_c/d = 4.$$

Figure 9:
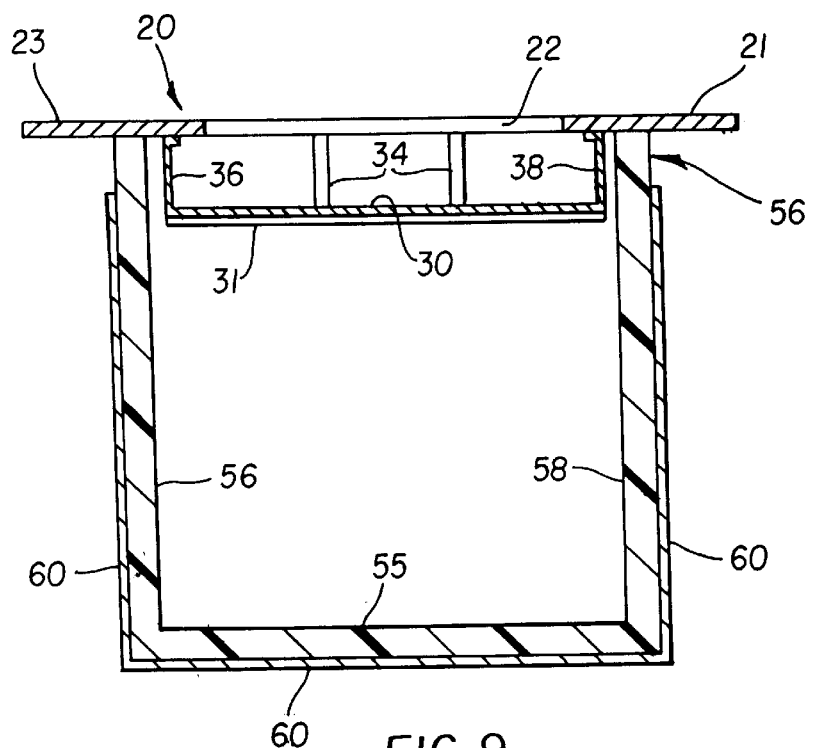
FIG. 9 is a schematic sectional view of a rectangular source illustrating the case where heating is substantially by radiation from a resistively heated top plate and baffle member with side walls and bottom wall made of electrically non-conductive materials and having the exterior surfaces of these walls coated with a mirror layer to retain most of the radiation from the top plate within the source housing.

Turning to FIG. 9, a schematic sectional view of a rectangular source is depicted in which heating of a solid organic electroluminescent material (not shown) occurs by radiation from a resistively heated top plate 20 and an attached baffle member 30, with side walls 56, 58 (and 52 and 54, not shown) and bottom wall 55 of housing 50 constructed of an electrically non-conductive material having an exterior surface thereof coated with a refractory metal mirror material 60 so as to retain most of the radiation from the top plate and from the baffle member within the source housing 50. The source housing is preferably constructed of quartz to reduce heating of the sidewalls by heat absorption or by thermal conduction. The refractory mirror can be a thin layer of nickel, tantalum, titanium, or molybdenum to reduce heat loss by transmission of radiation through the non-conductive source housing. Although the refractory metal mirror material is shown as a layer on an exterior surface of the housing 50, such mirror layer can be applied along the inside surfaces of the housing 50.

Similarly, the cylindrical source embodiment described with reference to FIGS. 7 and 8 can be constructed to have a housing 70 made of quartz and having a thin layer of a refractory mirror material formed over an exterior or interior surface of the cylindrical housing.

Figure 10:
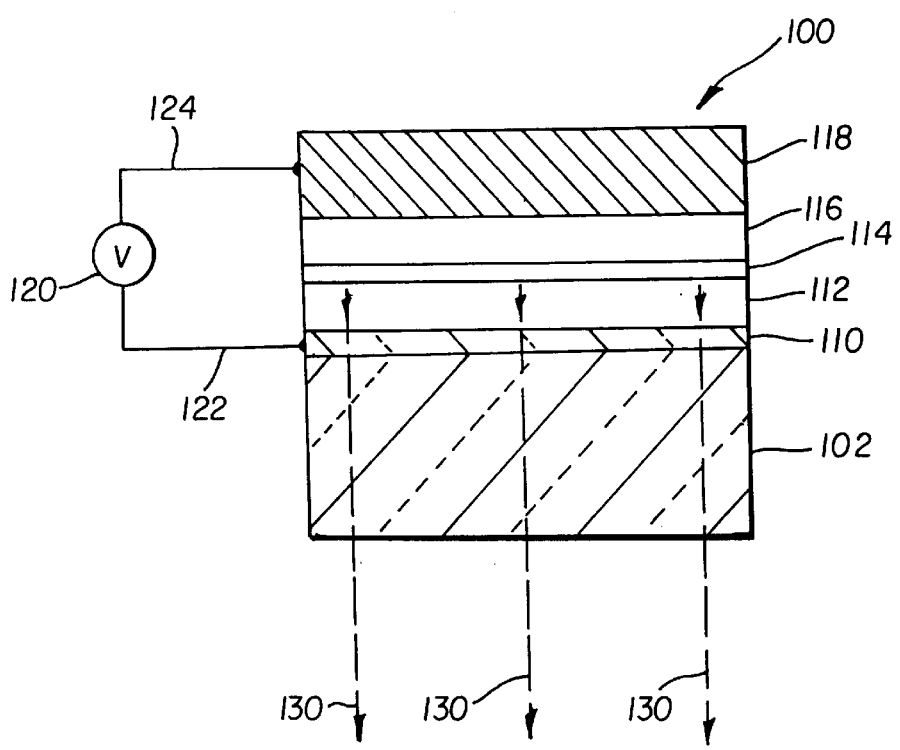
FIG. 10 is a schematic section view of an organic electroluminescent electroluminescent device having organic electroluminescent layers formed using a thermal physical vapor deposition source constructed in accordance with the present invention.

Turning to FIG. 10, a schematic section view of an organic electroluminescent device 100 having organic electroluminescent layers formed using a thermal physical vapor deposition source constructed in accordance with this invention in a physical vapor deposition system similar to the system 200 depicted in FIG. 4.

Over a light-transmissive substrate 102 are formed, in order, a light-transmissive anode 110, an organic hole-transporting layer 112, an organic light-emitting layer 114, an organic electron-transporting layer 116, and a cathode 118.

The organic electroluminescent materials useful in making an organic electroluminescent (EL) device can be selected from among the materials and preferred layers structures of conventional organic EL devices such as those described by Tang, U.S. Pat. No. 4,356,423; VanSlyke, et al, U.S. Pat. No. 4,539,507; VanSlyke, et al, U.S. Pat. No. 4,720,432; Tang, et al, U.S. Pat. No. 4,885,211; Tang, et al, U.S. Pat. No. 4,769,292; VanSlyke, et al, U.S. Pat. No. 5,047,687; VanSlyke, et al, U.S. Pat. No. 5,059,862; and VanSlyke, et al, U.S. Pat. No. 5,061,617; the disclosures of which are herein incorporated by reference.

The substrate 102 is preferably glass or quartz. The anode 110 is preferably an electrically conductive and light-transmissive layer formed of indium-tin-oxide (ITO). The organic hole-transporting layer 112, the organic light-emitting layer 114, and the organic electron-transporting layer 116 are formed by thermal physical vapor deposition from either the a rectangular source or from a cylindrical source of the present invention. The cathode 118 is formed by conventional vacuum deposition of a suitable metal, co-deposited metals, or enhanced electrode construction, such as magnesium and silver (Mg:Ag), LiF:Al, or similar.

When a device drive voltage source 120 is connected via lead 122 to the anode 110 and via lead 124 to the cathode 118, light is emitted by the organic light-emitting layer 114 whenever the anode 110 is at a more positive electrical potential (voltage) than the cathode 118. The emitted light 130 is shown in dashed outline as originating from the organic light-emitting layer 114 and being transmitted to an outside observer via the light-transmitting anode 110 and the light-transmitting substrate 102. It will be appreciated by those skilled in the art that deposition by the source of this invention may be used to deposited the organic electroluminescent layers for alternative EL-device structures.

The invention has been described in detail with particular reference to certain embodiments thereof, but it will be understood to that variations and modifications can be effected within the spirit and scope of the invention.

PARTS LIST

| | |
|---|---|
| 1 | rectangular thermal physical vapor deposition source |
| 10 | rectangular housing |
| 11 | electrical connecting flange |
| 12 | side wall |
| 13 | electrical connecting flange |
| 14 | side wall |
| 15 | bottom wall |
| 16 | end wall |
| 18 | end wall |

-continued

PARTS LIST

| | |
|---|---|
| 20 | rectangular top plate |
| 21 | electrical connecting flange |
| 22 | vapor efflux aperture |
| 23 | electrical connecting flange |
| 24 | vertical centerline |
| 25 | sealing lip |
| 27 | sealing lip |
| 30 | rectangular baffle member |
| 31 | baffle stabilizers |
| 32 | baffle support |
| 34 | baffle support |
| 36 | baffle termination |
| 38 | baffle termination |
| 40 | solid organic electroluminescent deposition material |
| 42 | initial level of solid organic electroluminescent deposition material |
| 44 | vapor of organic electroluminescent deposition material |
| 50 | electrically non-conductive housing |
| 55 | bottom wall of non-conductive housing |
| 56 | side wall of non-conductive housing |
| 58 | side wall of non-conductive housing |
| 60 | coating of refractory metal mirror material |
| 70 | cylindrical housing |
| 80 | circular top plate |
| 81 | electrical connecting flange |
| 82 | circular vapor efflux aperture |
| 83 | electrical connecting flange |
| 84 | vertical centerline |
| 90 | circular baffle member |
| 94 | baffle support |
| 100 | organic electroluminescent (EL) device |
| 102 | substrate |
| 104 | substrate mounting bracket |
| 106 | substrate mounting bracket |
| 110 | anode |
| 112 | organic hole-transporting |
| 114 | organic light-emitting layer |
| 116 | organic electron-transporting |
| 118 | cathode |
| 120 | device drive voltage source |
| 122 | lead |
| 124 | lead |
| 130 | emitted light |
| 200 | physical vapor deposition system |
| 202 | base plate |
| 204 | upper plate |
| 206 | chamber walls |
| 208 | vacuum seal |
| 210 | vacuum seal |
| 220 | vacuum pump |
| 222 | vacuum valve |
| 224 | pumping port |
| 230 | thermal insulation fixture/element |
| 240 | power source |
| 241 | electrical lead |
| 242 | current meter |
| 244 | electrical lead |
| 246 | electrical power feedthrough |
| 248 | connecting clamp |
| 254 | electrical lead |
| 256 | electrical power feedthrough |
| 258 | connecting clamp |
| 260 | pressure monitor port |
| 262 | pressure monitor |
| 270 | vapor deposition rate monitor element |
| 272 | electrical lead |
| 274 | rate monitor |
| b | width of rectangular baffle member |
| H | height of rectangular housing |
| L | distance from top plate along side wall(s) |
| m | spacing between baffle member and top plate |
| p | straightline projection |
| $w_h$ | width between side walls of housing |
| $w_s$ | width of vapor efflux aperture |
| $b_c$ | diameter of circular baffle member |
| $H_c$ | height of cylindrical housing |
| $L_c$ | distance from top plate along side wall(s) |
| $m_c$ | spacing between circular baffle and circular top plate |

-continued

PARTS LIST

| | |
|---|---|
| D | diameter of cylindrical housing |
| d | diameter of circular vapor efflux aperture |
| $t_h$ | thickness of housing side walls(s) |
| $t_t$ | thickness of top plate |

What is claimed is:

1. A thermal physical vapor deposition source for vaporizing solid organic electroluminescent materials and applying a vaporized electroluminescent material as a layer onto a surface of a substrate in forming a display device, comprising:

a) a housing defining an enclosure having side walls and a bottom wall, the enclosure receiving solid organic electroluminescent material which can be vaporized, and the width of the housing having a dimension $w_h$;

b) the housing is further defined by a top plate having an electrically conductive portion and defining a vapor efflux aperture slit having a width $w_s$ for permitting vaporized electroluminescent materials to pass through the slit onto a surface of a substrate;

c) an electrically conductive baffle member having a width b, the baffle member being centered on the slit and spaced from the side walls and spaced from the top plate by a distance m, the baffle member substantially providing a line-of-sight covering of the slit preventing direct access of vaporized electroluminescent materials to the slit, and preventing particulate electroluminescent materials from passing through the slit;

d) a straight-line projection from an edge of the slit to an edge of the baffle member onto a side wall defining a position on the side wall such that such position is spaced from the top plate by a dimension L;

e) the ratios of the dimensions: $w_h$ to $w_s$ being in a range of from 1.5 to 6.0; L to $w_s$ being in a range of from 2 to 6; and m to L being in a range of from 0.15 to 0.40; and f) means for applying an electrical potential to different parts of the housing to cause heat to be applied to the solid organic electroluminescent material in the enclosure causing the solid organic electroluminescent material to vaporize so that vaporized electroluminescent material is projected off of the side walls and the top plate of the housing and the top surface of the baffle member through the slit onto the substrate while particulate electroluminescent materials are prevented from passing through the slit by the baffle member.

2. A thermal physical vapor deposition source for vaporizing solid organic electroluminescent materials and applying a vaporized electroluminescent material as a layer onto a surface of a substrate in forming a display device, comprising:

a) a housing defining an enclosure having side walls and a bottom wall, the enclosure receiving solid organic electroluminescent material which can be vaporized, and the width of the housing having a dimension $w_h$;

b) the housing is further defined by a top plate having an electrically conductive portion and defining a vapor efflux aperture slit having a width $w_s$ for permitting vaporized electroluminescent materials to pass through the slit onto a surface of a substrate;

c) an electrically conductive baffle member having a width b, the baffle member being centered on the slit and spaced from the side walls and spaced from the top plate by a distance m, the baffle member substantially providing a line-of-sight covering of the slit preventing direct access of vaporized electroluminescent materials to the slit, and preventing particulate electroluminescent materials from passing through the slit;

d) a straight-line projection from an edge of the slit to an edge of the baffle member onto a side wall defining a position on the side wall such that such position is spaced from the top plate by a dimension L;

e) the ratios of the dimensions: $w_h$ to $w_s$ being in a range of from 1.5 to 6.0; L to $w_s$ being in a range of from 2 to 6; and m to L being in a range of from 0.15 to 0.40; and f) means for applying an electrical potential to the electrically conductive portion of the top plate and to the baffle member wherein the top plate and the baffle member apply heat to the solid organic electroluminescent material in the enclosure causing the solid organic electroluminescent material to vaporize so that vaporized electroluminescent material is projected off of the side walls and the top plate of the housing and the top surface of the baffle member through the slit onto the substrate while particulate electroluminescent materials are prevented from passing through the slit by the baffle member.

3. A thermal physical vapor deposition source for vaporizing solid organic hole-transporting material, organic electron-transporting material, or organic light-emitting material and applying the vaporized electroluminescent material as a layer onto a surface of a substrate which will provide an organic electroluminescent device, comprising:

a) a housing defining an enclosure having side walls and a bottom wall the enclosure receiving solid organic electroluminescent material which can be vaporized, and the width of the housing having a dimension $w_h$;

b) the housing is further defined by a top plate having an electrically conductive portion and defining an efflux aperture slit having a width $w_s$ for permitting vaporized electroluminescent materials to pass through the slit onto a surface of a substrate;

c) an electrically conductive baffle member having a width b, the baffle member being centered on the slit and spaced from the side walls and electrically connected to the conductive portion of the top plate and spaced from the top plate by a distance m, the baffle member substantially providing a line-of-sight covering of the slit preventing direct access of vaporized electroluminescent materials to the slit, and preventing particulate electroluminescent materials from passing through the slit;

d) a straight-line projection from an edge of the slit to an edge of each side of the baffle member onto the side walls defining a position on the side walls such that such position is spaced from the top plate by a dimension L;

e) the ratios of the dimensions: $w_h$ to $w_s$ being in a range of from 1.5 to 6.0; L to $w_s$ being in a range of from 2 to 6; and m to L being in a range of from 0.15 to 0.40; and f) a means for applying an electrical potential to the electrically conductive portion of the top plate which is connected to the baffle member so that the top plate and the baffle member apply heat to the solid organic electroluminescent material in the enclosure causing the solid organic electroluminescent material to vaporize so that vaporized electroluminescent material is projected off of the side walls and the top plate of the housing and the top surface of the baffle member through the slit onto a substrate while particulate electroluminescent materials are prevented from passing through the slit by the baffle member.

4. The thermal physical vapor deposition source of claim 3 wherein the ratio of the dimensions $w_h$ to $w_s$ is in a range 2.0 to 3.0, L to $w_s$ is in a range 3.5 to 5, and m to L is in a range 0.25 to 0.30.

5. The thermal physical vapor deposition source of claim 3 wherein the ratio of the dimensions $w_h$ to $w_s$ is 2.4, L to $w_s$ is 4, and m to L is 0.25.

6. The thermal physical vapor deposition source of claim 3 wherein the side and bottom walls of the housing are formed of an electrically non-conductive material.

7. The thermal physical vapor deposition source of claim 6 wherein the side and bottom walls of the housing are formed at least in part of quartz and the top plate is formed of tantalum.

8. The thermal physical vapor deposition source of claim 7 wherein an exterior or an interior surface of the side and bottom walls are coated at least in part with a refractory metal mirror material.

9. The thermal physical vapor deposition source of claim 8 wherein the refractive metal mirror material is selected from the group consisting of nickel, tantalum, molybdenum, titanium, and stainless steel.

10. A thermal physical vapor deposition source for vaporizing solid organic electroluminescent materials and applying a vaporized electroluminescent material as a layer onto a surface of a substrate, comprising:
  a) a cylindrical housing defining an enclosure having side walls and a bottom wall, the enclosure receiving solid organic electroluminescent material which can be vaporized, and the width of the housing having a diameter D;
  b) the cylindrical housing is further defined by a circular top plate having an electrically conductive portion and defining a circular vapor efflux aperture having a diameter d for permitting vaporized electroluminescent materials to pass through the aperture onto a surface of a substrate;
  c) an electrically conductive circular baffle member having a diameter $b_c$, the baffle member being centered on the aperture and spaced from the top plate by a distance $m_c$, the baffle member substantially providing a line-of-sight covering of the aperture preventing direct access of vaporized electroluminescent materials to the aperture, and preventing particulate electroluminescent materials from passing through the aperture;
  d) a straight-line projection from the edge of the aperture to the edge of the baffle member onto a side wall defining a position on the side wall such that such position is spaced from the top plate by a dimension $L_c$;
  e) the ratios of the dimensions: D to d being in a range of from 1.5 to 6.0; $L_c$ to d being in a range of from 2 to 6; and m to $L_c$ being in a range of from 0.15 to 0.40; and
  f) means for applying an electrical potential to the electrically conductive portion of the circular top plate and to the circular baffle member wherein the circular top plate and the circular baffle member apply heat to the solid organic electroluminescent material in the enclosure causing the solid organic electroluminescent material to vaporize so that vaporized electroluminescent material is projected off of the side walls and the circular top plate of the housing and the top surface of the circular baffle member through the circular aperture slit onto the substrate while particulate electroluminescent materials are prevented from passing through the circular aperture by the circular baffle member.

11. The thermal physical vapor deposition source of claim 10 wherein the side and bottom walls of the housing are formed of an electrically non-conductive material.

12. The thermal physical vapor deposition source of claim 11 wherein the side and bottom walls of the housing are formed at least in part of quartz and the top plate is formed of tantalum.

13. The thermal physical vapor deposition source of claim 12 wherein an exterior or an interior surface of the side and bottom walls are coated at least in part with a refractory metal mirror material.

14. The thermal physical vapor deposition source of claim 13 wherein the refractive metal mirror material is selected from the group consisting of nickel, tantalum, molybdenum, titanium, and stainless steel.

15. The thermal physical vapor deposition source of claim 10 wherein the ratio of the dimensions D to d is in a range 2.0 to 3.0, L to d is in a range 3.5 to 5, and $m_c$ to $L_c$ is in a range 0.25 to 0.30.

16. The thermal physical vapor deposition source of claim 10 wherein the ratio of the dimensions D to d is 2.4, L to d is 4, and $m_c$ to $L_c$ is 0.25.

17. A thermal physical vapor deposition source for vaporizing solid organic hole-transporting material, organic electron-transporting material, or organic light-emitting material and applying the vaporized electroluminescent material as a layer onto a surface of a substrate which will provide an organic electroluminescent device, comprising:
  a) a cylindrical housing defining an enclosure having side walls and a bottom wall, the enclosure receiving solid organic electroluminescent material which can be vaporized, and the width of the housing having a diameter D;
  b) the cylindrical housing is further defined by a circular top plate having an electrically conductive portion and defining a circular vapor efflux aperture having a diameter d for permitting vaporized electroluminescent materials to pass through the aperture onto a surface of a substrate;
  c) an electrically conductive circular baffle member having a diameter $b_c$, the baffle member being centered on the aperture and spaced from the top plate by a distance $m_c$, the baffle member substantially providing a line-of-sight covering of the aperture preventing direct access of vaporized electroluminescent materials to the aperture, and preventing particulate electroluminescent materials from passing through the aperture;
  d) a straight-line projection from the edge of the aperture to the edge of the baffle member onto a side wall defining a position on the side wall such that such position is spaced from the top plate by a dimension $L_c$;
  e) the ratios of the dimensions: D to d being in a range of from 1.5 to 6.0; $L_c$ to d being in a range of from 2 to 6; and m to $L_c$ being in a range of from 0.15 to 0.40; and
  f) means for applying an electrical potential to the electrically conductive portion of the circular top plate which is connected to the circular baffle member so that the circular top plate and the circular baffle member apply heat to the solid organic electroluminescent material in the enclosure causing the solid organic electroluminescent material to vaporize so that vaporized electroluminescent material is projected off of the side walls and the circular top plate of the housing and the top surface of the circular baffle member through the circular aperture onto a substrate while particulate electroluminescent materials are prevented from passing through the circular aperture by the circular baffle member.

* * * * *